(12) United States Patent
Koo et al.

(10) Patent No.: US 10,324,835 B2
(45) Date of Patent: Jun. 18, 2019

(54) DATA STORAGE DEVICE AND OPERATING METHOD THEREOF

(71) Applicant: SK hynix Inc., Gyeonggi-do (KR)

(72) Inventors: Duck Hoi Koo, Gyeonggi-do (KR); Yong Jin, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/885,262

(22) Filed: Jan. 31, 2018

(65) Prior Publication Data

US 2019/0018767 A1 Jan. 17, 2019

(30) Foreign Application Priority Data

Jul. 11, 2017 (KR) ........................ 10-2017-0087670

(51) Int. Cl.
| | | |
|---|---|---|
| *G11C 16/04* | (2006.01) | |
| *G06F 12/02* | (2006.01) | |
| *G11C 16/10* | (2006.01) | |
| *G06F 12/0882* | (2016.01) | |
| *G06F 12/123* | (2016.01) | |
| *G06F 12/0846* | (2016.01) | |

(52) U.S. Cl.
CPC ...... *G06F 12/0246* (2013.01); *G06F 12/0851* (2013.01); *G06F 12/0882* (2013.01); *G06F 12/123* (2013.01); *G11C 16/10* (2013.01); *G11C 16/0483* (2013.01)

(58) Field of Classification Search
CPC ............ G06F 12/0851; G06F 12/0882; G06F 12/123; G11C 16/10
USPC ................................................... 365/185.03
See application file for complete search history.

(56) References Cited

U.S. PATENT DOCUMENTS

| 7,631,138 | B2 * | 12/2009 | Gonzalez | ............ G06F 12/0246 |
| | | | | 365/189.04 |
| 9,606,730 | B2 * | 3/2017 | Jun | ......... G11C 16/10 |
| 2005/0144361 | A1 * | 6/2005 | Gonzalez | ............ G06F 12/0246 |
| | | | | 711/103 |
| 2007/0002612 | A1 * | 1/2007 | Chang | ................... G06F 3/0608 |
| | | | | 365/185.01 |
| 2011/0035538 | A1 * | 2/2011 | Kim | ...................... G11C 16/10 |
| | | | | 711/103 |
| 2011/0149650 | A1 * | 6/2011 | Huang | ............... G06F 12/0246 |
| | | | | 365/185.03 |

(Continued)

FOREIGN PATENT DOCUMENTS

KR 1020130123955 11/2013

*Primary Examiner* — Xiaochun L Chen
(74) *Attorney, Agent, or Firm* — IP & T Group LLP (57) ABSTRACT

A data storage device includes a first nonvolatile memory device including first LSB, CSB and MSB pages; a second nonvolatile memory device including second LSB, CSB and MSB pages; a data cache memory is configured to store data write-requested from a host device; and a control unit suitable for configuring the first and second LSB pages as an LSB super page, configuring the first and second CSB pages as a CSB super page, and configuring the first and second MSB pages as an MSB super page, wherein the control unit is configured to one-shot programs the data stored in the data cache memory in the first LSB, CSB and MSB pages when determination is made as a data stability mode, and is configured to one-shot programs data stored in the data cache memory in the LSB, CSB and MSB super pages in a performance-improving mode.

17 Claims, 11 Drawing Sheets

(56) References Cited

U.S. PATENT DOCUMENTS

| | | | |
|---|---|---|---|
| 2011/0222342 A1* | 9/2011 | Yoon | G11C 11/56 365/185.03 |
| 2016/0099065 A1* | 4/2016 | Lasser | G11C 16/20 365/185.03 |
| 2016/0253099 A1* | 9/2016 | Jun | G11C 16/10 711/103 |

* cited by examiner

DATA STORAGE DEVICE AND OPERATING METHOD THEREOF

CROSS-REFERENCES TO RELATED APPLICATION

The present application claims priority under 35 U.S.C. § 119(a) to Korean application number 10-2017-0087670, filed on Jul. 11, 2017, in the Korean Intellectual Property Office, which is incorporated herein by reference in its entirety.

BACKGROUND

1. Technical Field

Various embodiments generally relate to a data storage device which uses a nonvolatile memory device as a storage medium.

2. Related Art

Recently, the paradigm for the computer environment has been converted into ubiquitous computing so that computer systems can be used anytime and anywhere. Due to this fact, the use of portable electronic devices such as mobile phones, digital cameras, and notebook computers has rapidly increased. In general, such portable electronic devices use a data storage device which uses a memory device for storing data which are to be used in the portable electronic devices.

A data storage device using a memory device has no mechanical driving part and provides advantages including generally excellent stability and durability high information access speed and small power consumption. Examples of data storage devices having such advantages include a universal serial bus (USB) memory device, memory cards having various interfaces, a universal flash storage (UFS) device, and a solid state drive (SSD).

SUMMARY

Various embodiments are directed to a data storage device and an operating method thereof capable of quickly and stably storing data in a nonvolatile memory device. The data which are stored may be provided from a host device and may be requested to be stored by the host device.

In an embodiment, a data storage device may include: a first nonvolatile memory device including a first least significant bit (LSB) page, a first central significant bit (CSB) page and a first most significant bit (MSB) page; a second nonvolatile memory device including a second LSB page, a second CSB page and a second MSB page; a data cache memory is configured to store data write-requested from a host device; and a control unit suitable for configuring the first LSB page and the second LSB page as an LSB super page, configuring the first CSB page and the second CSB page as a CSB super page, and configuring the first MSB page and the second MSB page as an MSB super page, wherein the control unit is configured to one-shot programs the data stored in the data cache memory in the first LSB page, the first CSB page and the first MSB page in a data stability mode, and is configured to one-shot programs data stored in the data cache memory in the LSB super page, the CSB super page and the MSB super page in a performance-improving mode.

In an embodiment, a method for operating a data storage device including a first nonvolatile memory device including a first lower page, a first middle page and a first upper page, a second nonvolatile memory device including a second lower page, a second middle page and a second upper page and a data cache memory temporarily storing data write-requested from a host device may include: configuring the first lower page and the second lower page as a first super page, configuring the first middle page and the second middle page as a second super page, and configuring the first upper page and the second upper page as a third super page; simultaneously programming data stored in the data cache memory, in the first lower page, the first middle page and the first upper page in a data stability mode; and simultaneously programming data stored in the data cache memory, in the first super page, the second super page and the third super page in the data stability mode.

In an embodiment, a data storage device may include: a plurality of memory devices each including one or more multi-level cell (MLC) pages, wherein the MLC pages respectively selected from the respective memory devices are operable as MLC super pages; a data cache memory suitable for caching data; and a control unit suitable for controlling the memory devices to perform an one-shot program operation to the MLC super pages with the cached data, wherein the control unit is further suitable for controlling the memory devices to perform an one-shot program operation to the MLC pages of a selected one among the memory devices with the cached data in a data stability mode.

Various embodiments of the present invention are described herein with reference to the appended drawings.

DETAILED DESCRIPTION

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes " and/or "including," when used in this specification, specify the presence of at least one stated feature, step, operation, and/or element, but do not preclude the presence or addition of one or more other features, steps, operations, and/or elements thereof.

Figure 1:
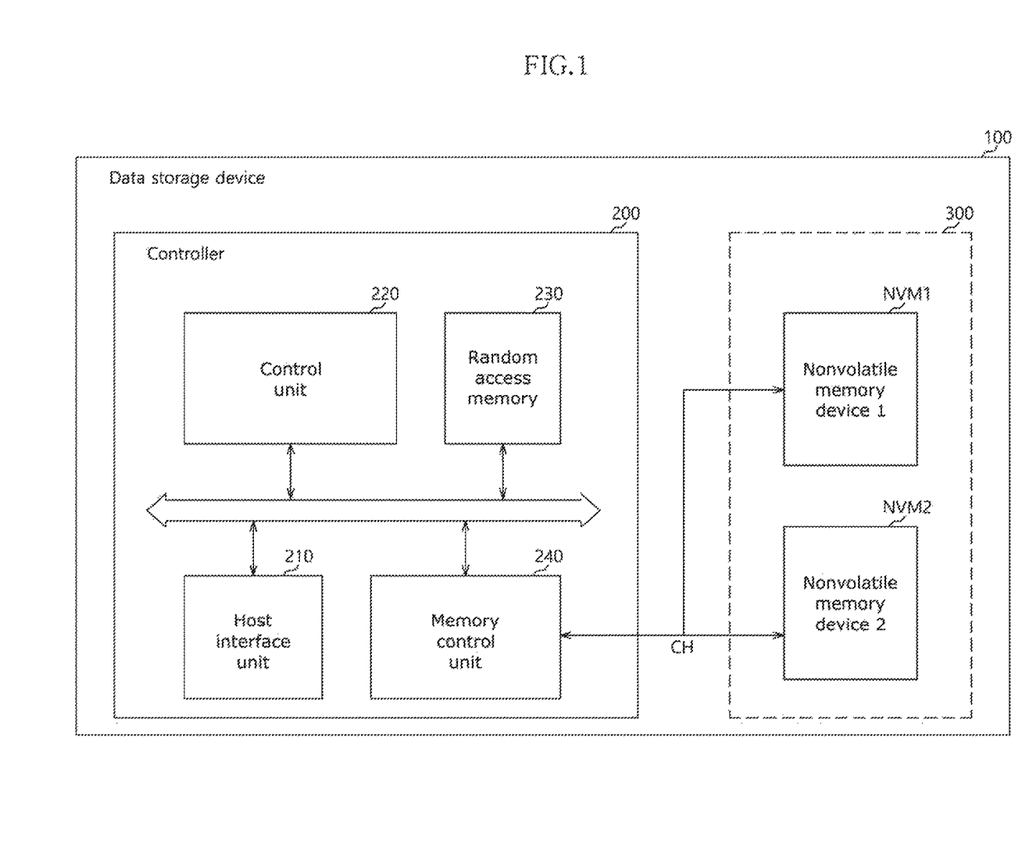
FIG. 1 is a block diagram illustrating a data storage device, in accordance with an embodiment of the present invention.

FIG. 1 is a block diagram illustrating a data storage device 100 in accordance with an embodiment. The data storage device 100 may store data to be accessed by a host device (not shown) such as a mobile phone, an MP3 player, a laptop computer, a desktop computer, a game player, a TV, an in-vehicle infotainment system, and so forth. The data storage device 100 may also be referred to as a memory system.

The data storage device 100 may be manufactured as any one of various kinds of storage devices according to a host interface meaning a transmission protocol with respect to the host device. For example, the data storage device 100 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one among various kinds of package types. For example, the data storage device 100 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 100 may include a controller 200. The controller 200 may include a host interface unit 210, a control unit 220, a random access memory 230, and a memory control unit 240 operatively coupled via an internal bus generally indicated by a double headed wide arrow in FIG. 1.

The host interface unit 210 interfaces the host device and the data storage device 100. For example, the host interface unit 210 may communicate with the host device by using a host interface, that includes any one among standard transmission protocols such as universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The control unit 220 may be configured by a micro control unit (MCU) or a central processing unit (CPU). The control unit 220 may process a request which is transmitted from the host device. In order to process the request, the control unit 220 may drive an instruction or algorithm of a code type, that is, a software, loaded in the random access memory 230, and may control the internal function blocks 210, 230 and 240 and a nonvolatile memory device 300.

The random access memory 230 may be configured by a random access memory such as a dynamic random access memory (DRAM) or a static random access memory (SRAM). The random access memory 230 may store a software to be driven by the control unit 220. Further, the random access memory 230 may store data necessary for driving of the software. That is to say, the random access memory 230 may operate as the working memory of the control unit 220.

The random access memory 230 may temporarily store data to be transmitted from the host device to the nonvolatile memory device 300 or from the nonvolatile memory device 300 (as a storage medium) to the host device. In other words, the random access memory 230 may operate as a data cache memory.

The memory control unit 240 may control the nonvolatile memory device 300 according to the control of the control unit 220. The memory control unit 240 may also be referred to as a memory interface unit. The memory control unit 240 may provide control signals to the nonvolatile memory device 300. The control signals may include a command, an address, a control signal and so forth for controlling the nonvolatile memory device 300 storage medium 300. The memory control unit 240 may provide data to the nonvolatile memory device 300 or may be provided with data from the nonvolatile memory device 300.

The data storage device 100 may include the storage medium 300 for storing data. The storage medium 300 may include nonvolatile memory devices NVM1 and NVM2. The number of nonvolatile memory devices included in the storage medium 300 may be changed variously. For example, the storage medium 300 may include one or more nonvolatile memory devices. The nonvolatile memory devices NVM1 and NVM2 may be coupled with the controller 200 through a channel CH which includes at least one signal line capable of transmitting a command, an address, control signals and data.

The nonvolatile memory devices 300 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using a transition metal oxide.

Figure 2:
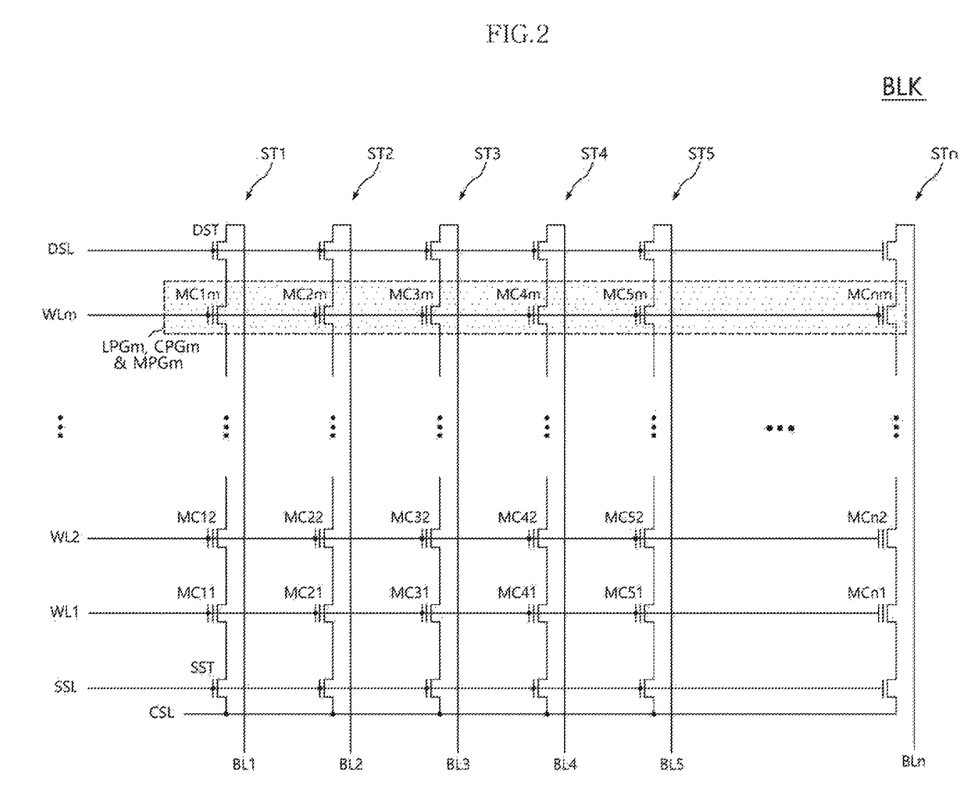
FIG. 2 is a circuit diagram illustrating an exemplary memory block of a nonvolatile memory device, in accordance with an embodiment.
Figure 3:
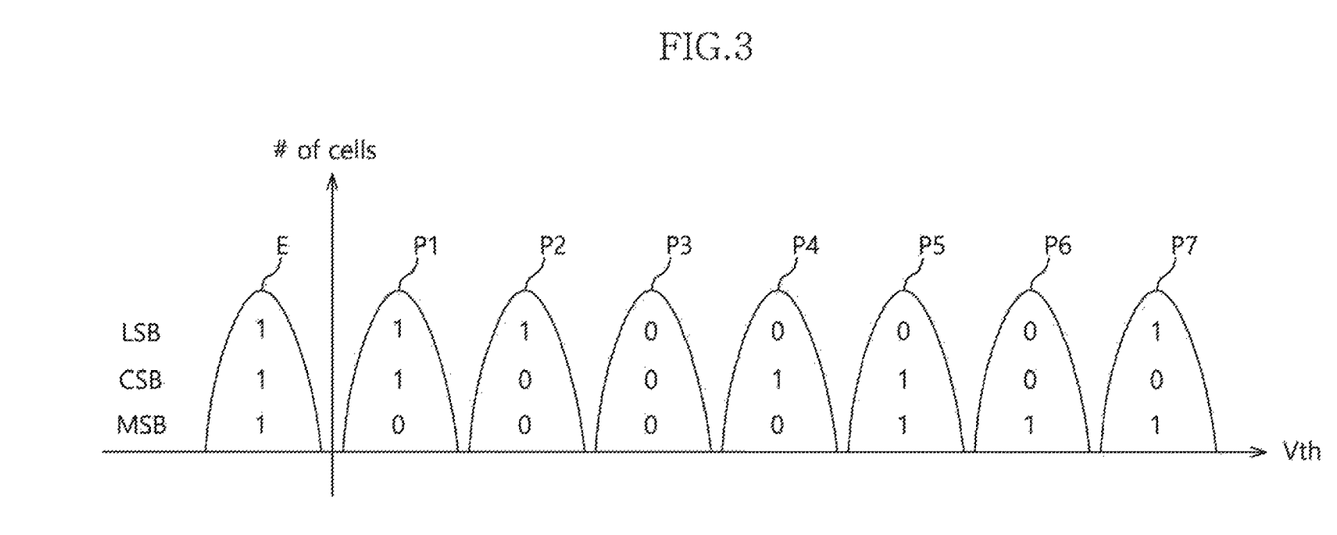
FIG. 3 is a diagram illustrating exemplary threshold voltage distributions of memory cells in accordance with an embodiment.
Figure 4:
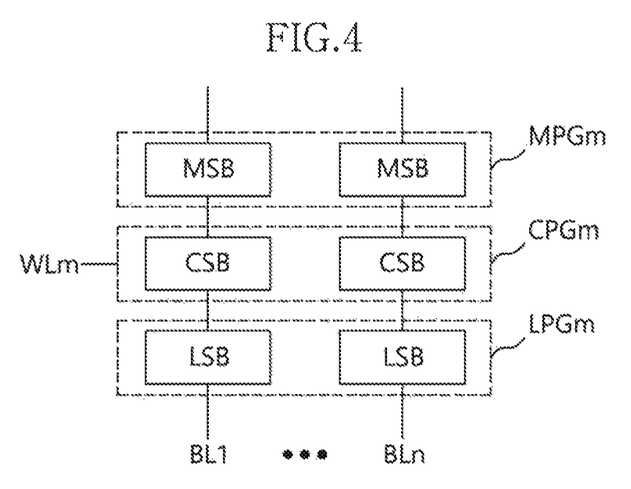
FIG. 4 is a diagram illustrating an exemplary configuration of a page, in accordance with an embodiment.

FIG. 2 is a circuit diagram illustrating a memory block of a nonvolatile memory device in accordance with the embodiment of FIG. 1. FIG. 3 is a diagram illustrating exemplary threshold voltage distributions of memory cells in accordance with an embodiment. FIG. 4 is a diagram illustrating the configuration of a page in accordance with an embodiment.

From an operational viewpoint or a physical (or structural) viewpoint, the memory cells of the nonvolatile memory devices NVM1 and NVM2 of FIG. 1 may be configured by hierarchical memory cell sets such as memory blocks BLK and pages PG.

Referring to FIG. 2, a memory block BLK which is configured by memory cells which can be erased simultaneously may include a plurality of cell strings ST1 to STn which are coupled to a plurality of bit lines BL1 to BLn. The cell strings ST1 to STn have the same circuit configuration, and for the sake of convenience in explanation, one cell string ST1 will be described below representatively.

The cell string ST1 may include a plurality of memory cells MC11 to MC1m and select transistors DST and SST which are coupled between the bit line BL1 and a common source line CSL. In more detail, the cell string ST1 may include a drain select transistor DST which is coupled to a drain select line DSL, the plurality of memory cells MC11 to MC1m which are respectively coupled to a plurality of word lines WL1 to WLm, and a source select transistor SST which is coupled to a source select line SSL.

Referring to FIG. 3, the threshold voltage distributions of memory cells MC1m to MCnm which are configured by 3-bit multilevel cells each capable of storing 3-bit data will be exemplified representatively. In this case, the memory cells MC1m to MCnm may be erased to have threshold voltages of an erase state E. Also, the memory cells MC1m to MCnm may be programmed to have threshold voltages of any one among a plurality of program states P1, P2, P3, P4, P5, P6 and P7 (P1 to P7 states) according to least significant bit (LSB) data (or lower bit data), central significant bit (CSB) data (or middle bit data) and most significant bit (MSB) data (or upper bit data).

Referring to FIG. 4, the page configurations of the memory cells MC1m to MCnm which are configured by 3-bit multilevel cells each capable of storing 3-bit data will be exemplified representatively. The memory cells MC1m to MCnm may configure different types of pages according to types of data stored therein. For example, the memory cells MC1m to MCnm which store LSB data may configure an LSB type page LPG (hereafter, referred to as an LSB page) or a lower page. The memory cells MC1m to MCnm which store CSB data may configure a CSB type page CPG (hereafter, referred to as a CSB page) or a middle page. The memory cells MC1m to MCnm which store MSB data may configure an MSB type page MPG (hereafter, referred to as an MSB page) or an upper page. That is to say, the memory cells MC1m to MCnm which are coupled to the same word line WLm and are to be read and programmed (or written) simultaneously may be configured by three logical pages LPGm, CPGm and MPGm. In the following descriptions, for the sake of convenience in explanation, memory cells configured as a page PG will be referred to as a "page."

Figure 5:
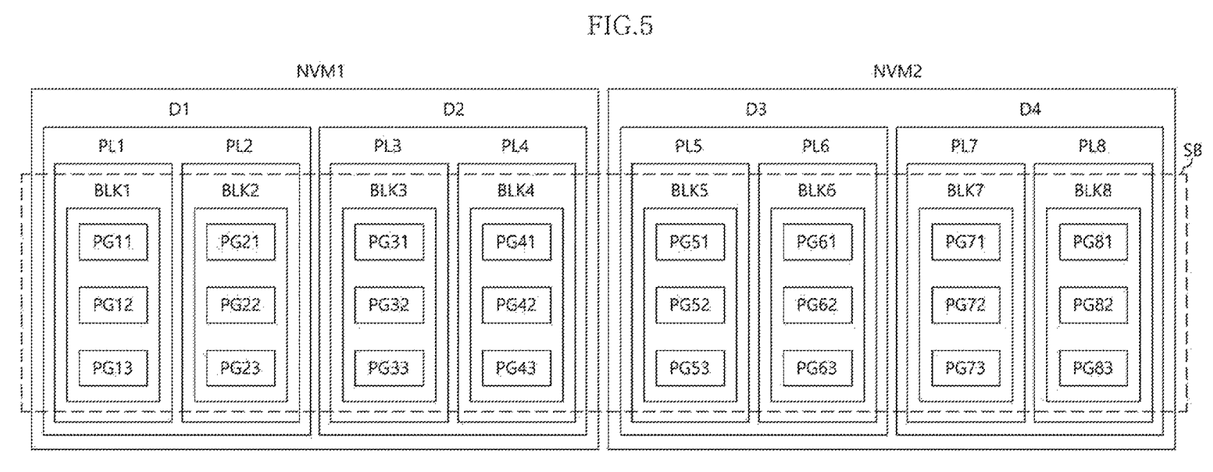
FIG. 5 is a diagram illustrating the configuration of a super block, in accordance with an embodiment.

FIG. 5 is a diagram illustrating the configuration of a super block in accordance with an embodiment. For the sake of convenience in explanation, the nonvolatile memory devices NVM1 and NVM2 each of which is configured by two memory dies, two planes per memory die, one memory block per plane and three pages per memory block will be exemplified representatively. The number of memory dies, the number of planes per memory die, the number of memory blocks per plane and the number of pages per memory block in each of the nonvolatile memory devices NVM1 and NVM2 may be changed variously.

A memory die may be defined as a single chip which is separated from a wafer along a scribe line. Also, a plane may be defined as a unit by which memory blocks capable of being controlled in parallel by a different write driver or sense amplifier in a memory die are grouped.

In order to increase the data throughput of the nonvolatile memory devices NVM1 and NVM2, the control unit 220 may control memory blocks in groups. Each group includes a plurality of memory blocks capable of operating in parallel under the control of the control unit 220. Grouped memory blocks may be referred to as a super block. For example, referring to FIG. 5, a first memory block BLK1 to an eighth memory block BLK8 capable of operating in parallel due to the structure of nonvolatile memory devices, memory dies and planes may be configured as a super memory block SB.

Figure 6:
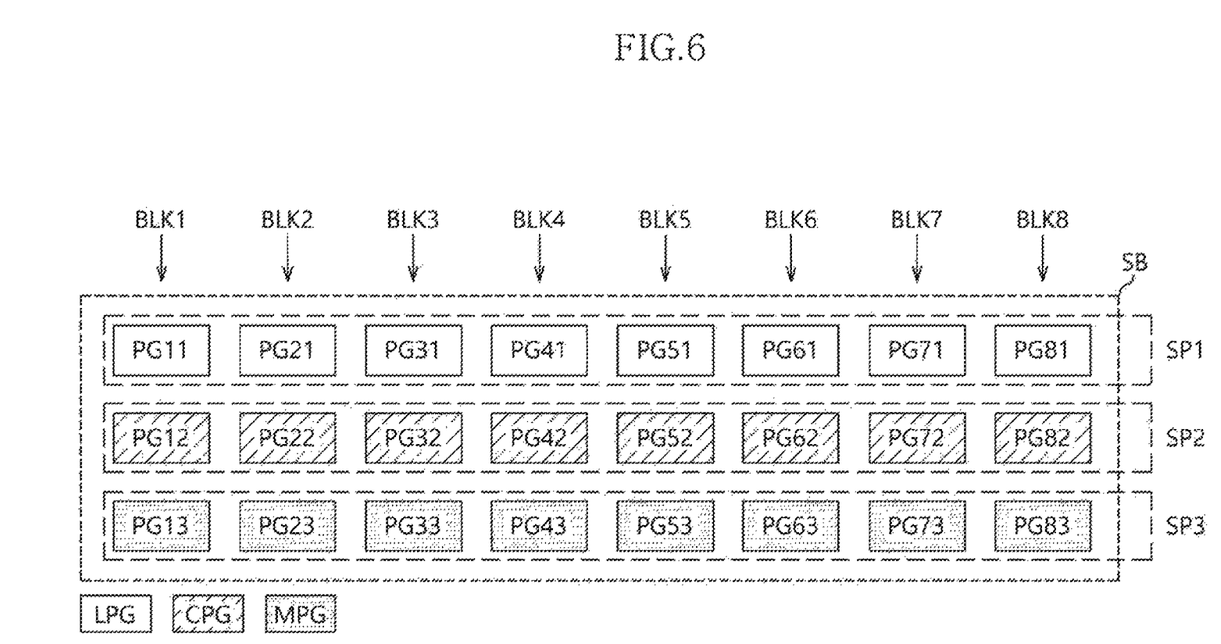
FIG. 6 is a diagram illustrating an exemplary configuration of a super page, in accordance with an embodiment.

FIG. 6 is a diagram illustrating the configuration of an exemplary super page in accordance with an embodiment. For the sake of convenience in explanation, the super block SB of FIG. 5 will be illustrated.

In order to increase the data throughput of the nonvolatile memory devices NVM1 and NVM2, the control unit 220 may control pages in groups each including a plurality of pages capable of operating in parallel. Grouped pages may be referred to as a super page or a stripe. In order to increase the data throughput of the nonvolatile memory devices NVM1 and NVM2, the control unit 220 may operate pages configuring a super page in an interleaving scheme.

For example, referring to FIG. 6, pages PG11 to PG81 of the first memory block BLK1 to the eighth memory block BLK8 may be configured as a first super page SP1. Pages PG11 to PG81 can be operated in parallel due to the architecture of the memory dies and planes of the nonvolatile memory device. Likewise, pages PG12 to PG82 may be configured as a second super page SP2, and pages PG13 to PG83 may be configured as a third super page SP3. The pages PG11 to PG81 of the first super page SP1 may be operated in the interleaving scheme. The pages PG12 to PG82 of the second super page SP2 may also be operated in the interleaving scheme. Further, the pages PG13 to PG83 of the third super page SP3 may be operated in the interleaving scheme.

A super page type may be determined based on the type of the pages configuring the super page. For example, the type of the first super page SP1 which is configured with only the LSB pages PG11 to PG81 may be an LSB page, the type of the second super page SP2 which is configured with only the CSB pages PG12 to PG82 may be a CSB page, and the type of the third super page SP3 configured with only the MSB pages PG13 to PG83 may be an MSB page.

Figure 7:
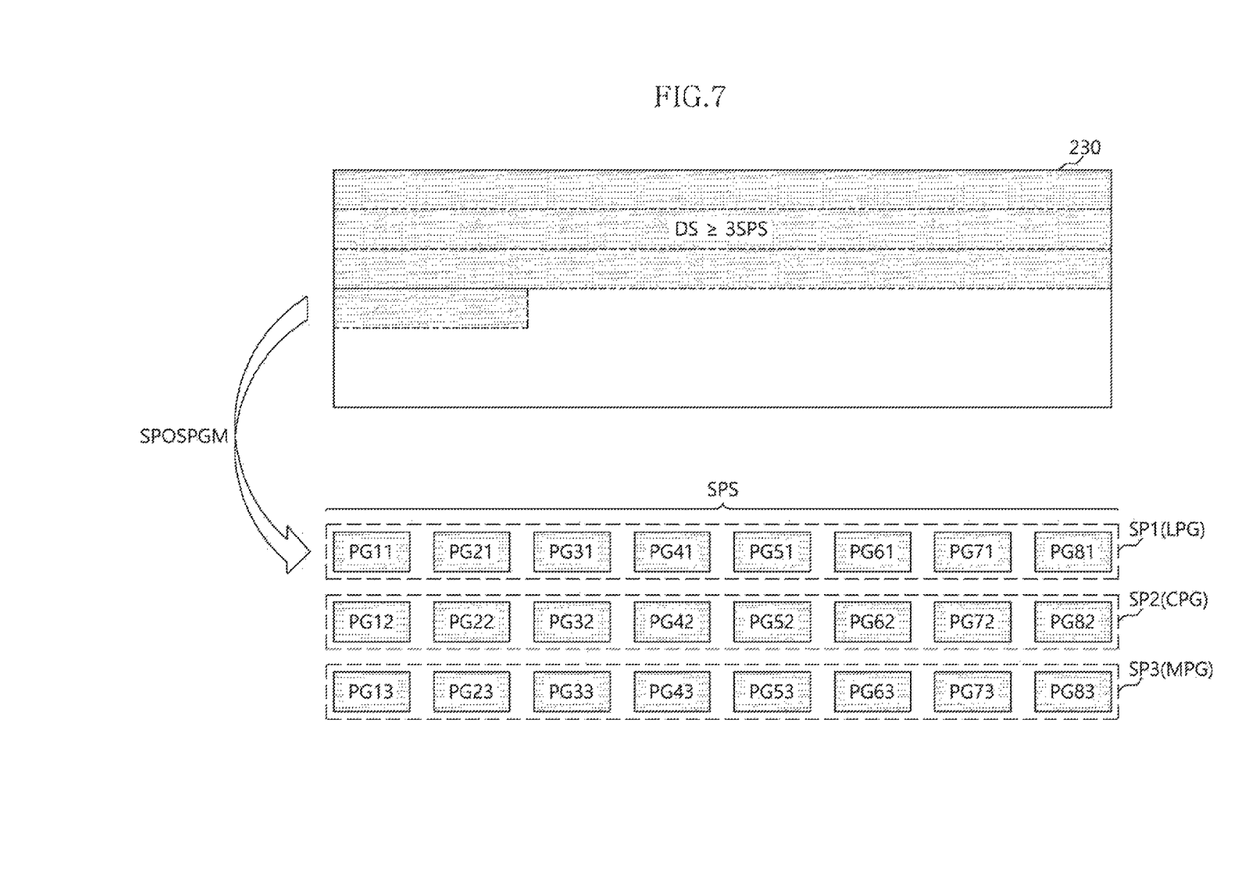
FIG. 7 is a diagram illustrating an exemplary super page one-shot program method, in accordance with an embodiment.

FIG. 7 is a diagram illustrating a super page one-shot program method in accordance with an embodiment. Hereunder, the total size of the pages configuring a super page will be defined as the size of the super page or the super page size SPS.

FIG. 7 illustrates a case where a request to store data having a data size DS which is equal to or larger than three times the super page size 3SPS is provided from the host device and the write-requested data is temporarily stored in the random access memory 230 used as a data cache memory.

In this case, in order to increase the data throughput of the nonvolatile memory devices NVM1 and NVM2, the control unit 220 may store the data of the random access memory 230 in the nonvolatile memory devices NVM1 and NVM2 by using a method defined as a super page one-shot program method SPOSPGM. According to the super page one-shot program method SPOSPGM, data having a size equal to three times the super page size 3SPS may be simultaneously programmed in the LSB type super page SP1, the CSB type super page SP2 and the MSB type super page SP3.

According to the super page one-shot program method SPOSPGM, the LSB pages PG11 to PG81, the CSB pages PG12 to PG82 and the MSB pages PG13 to PG83 respectively configuring the super pages SP1, SP2 and SP3 may be simultaneously programmed by plane according to a one-shot program method by which an LSB page LPG, a CSB page CPG and an MSB page MPG coupled to the same word line are simultaneously programmed.

For example, the LSB page PG11, the CSB page PG12 and the MSB page PG13 included in the first plane PL1 of the first nonvolatile memory device NVM1 may be simultaneously programmed, the LSB page PG21, the CSB page PG22 and the MSB page PG23 included in the second plane PL2 of the first nonvolatile memory device NVM1 may be simultaneously programmed, the LSB page PG31, the CSB page PG32 and the MSB page PG33 included in the third plane PL3 of the first nonvolatile memory device NVM1 may be simultaneously programmed, the LSB page PG41, the CSB page PG42 and the MSB page PG43 included in the fourth plane PL4 of the first nonvolatile memory device NVM1 may be simultaneously programmed, the LSB page PG51, the CSB page PG52 and the MSB page PG53 included in the fifth plane PL5 of the second nonvolatile memory device NVM2 may be simultaneously programmed, the LSB page PG61, the CSB page PG62 and the MSB page PG63 included in the sixth plane PL6 of the second nonvolatile memory device NVM2 may be simultaneously programmed, the LSB page PG71, the CSB page PG72 and the MSB page PG73 included in the seventh plane PL7 of the second nonvolatile memory device NVM2 may be simultaneously programmed, and the LSB page PG81, the CSB page PG82 and the MSB page PG83 included in the eighth plane PL8 of the second nonvolatile memory device NVM2 may be simultaneously programmed.

Figure 8:
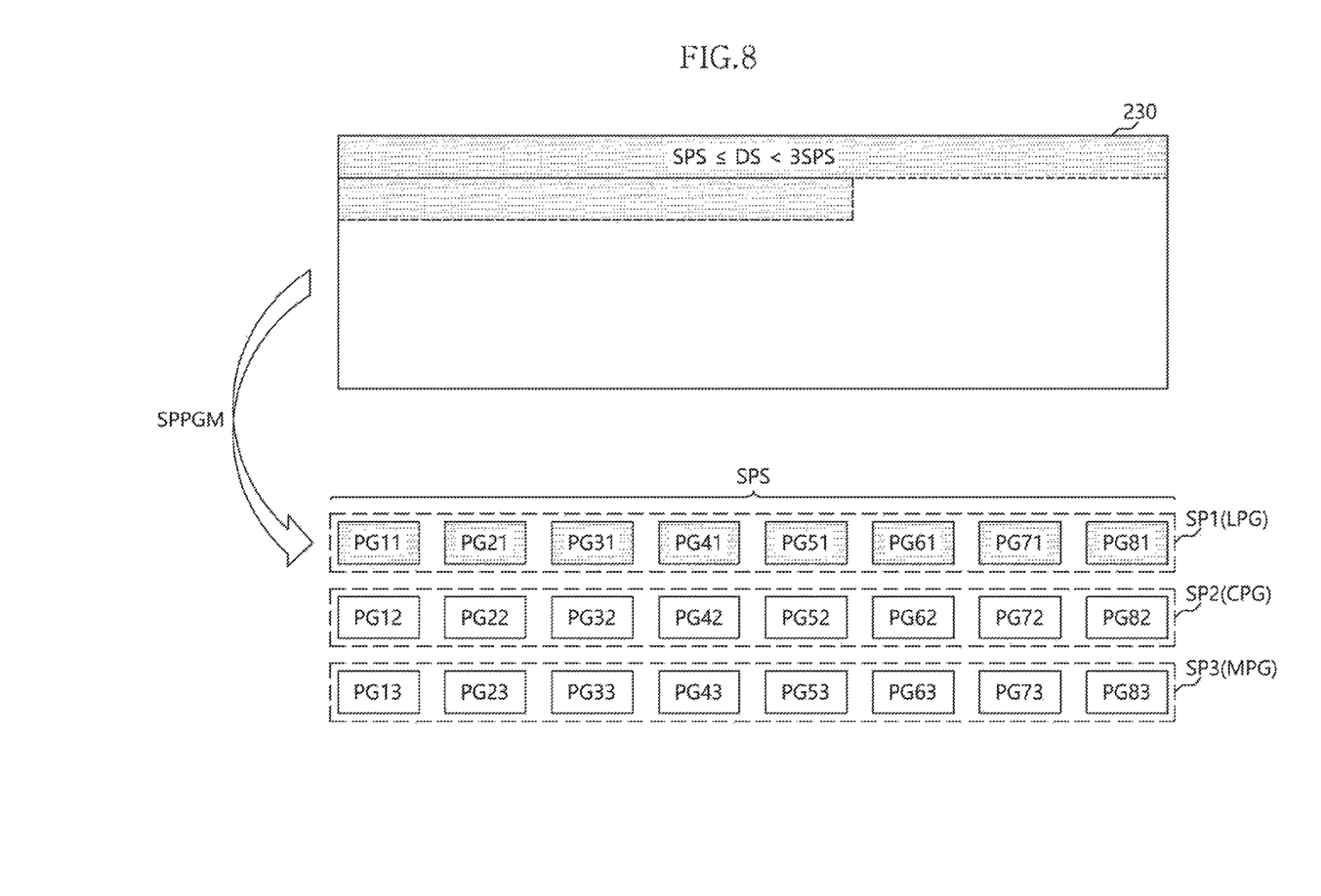
FIG. 8 is a diagram illustrating a super page program method, in accordance with an embodiment.

FIG. 8 is a diagram illustrating a super page program method (SPPGM) in accordance with an embodiment.

FIG. 8 illustrates a case where a request is provided from the host device to store data having a data size DS that is smaller than three times the super page size 3SPS but equal to or larger than one super page size SPS. The write-requested data is temporarily stored in the random access memory 230 used as a data cache memory.

In this case, in order to increase the data throughput of the nonvolatile memory devices NVM1 and NVM2, the control unit 220 may store the data of the random access memory 230 in the nonvolatile memory devices NVM1 and NVM2 by using a method defined as a super page program method SPPGM. According to the super page program method SPPGM, data of one super page size SPS may be programmed in any one among the super pages SP1 to SP3, for example, the LSB type super page SP1.

Figure 9:
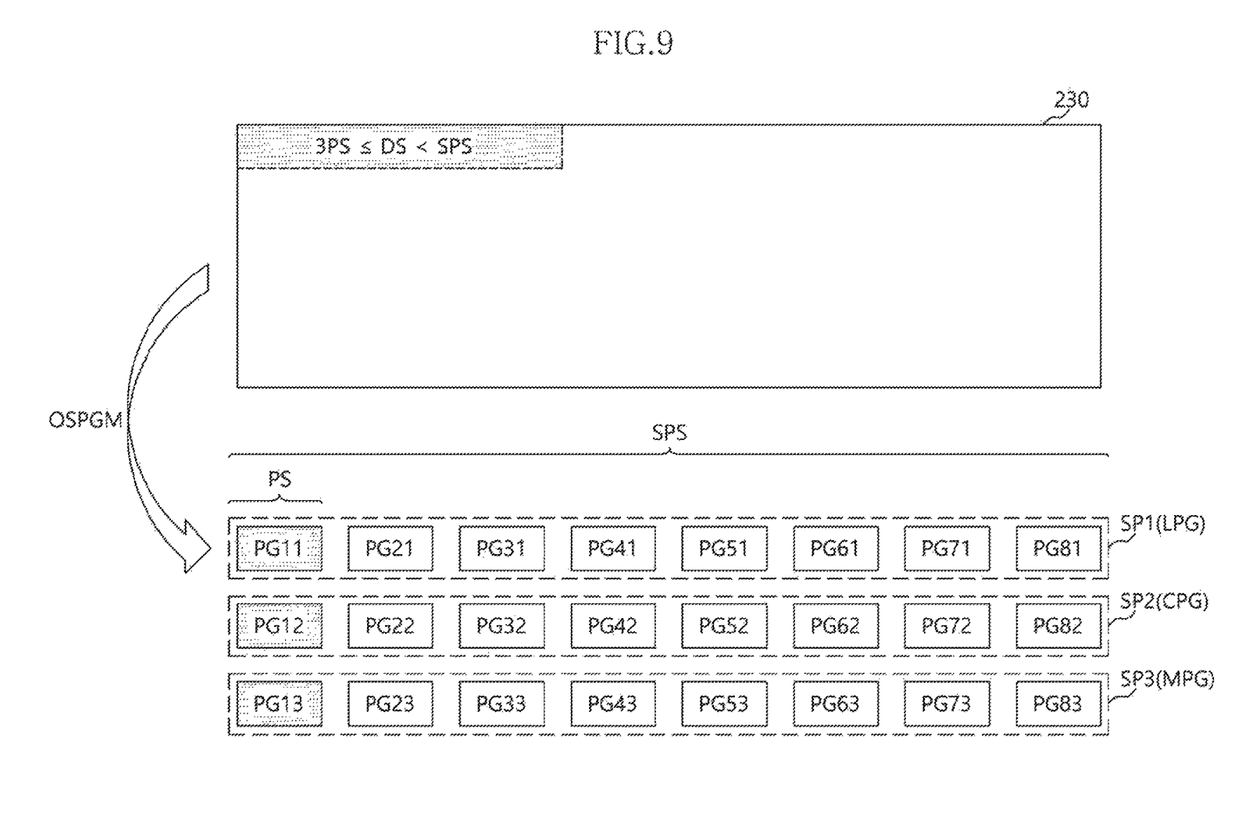
FIGS. 9 and 10 are diagrams illustrating a one-shot program method, in accordance with an embodiment.
Figure 10:
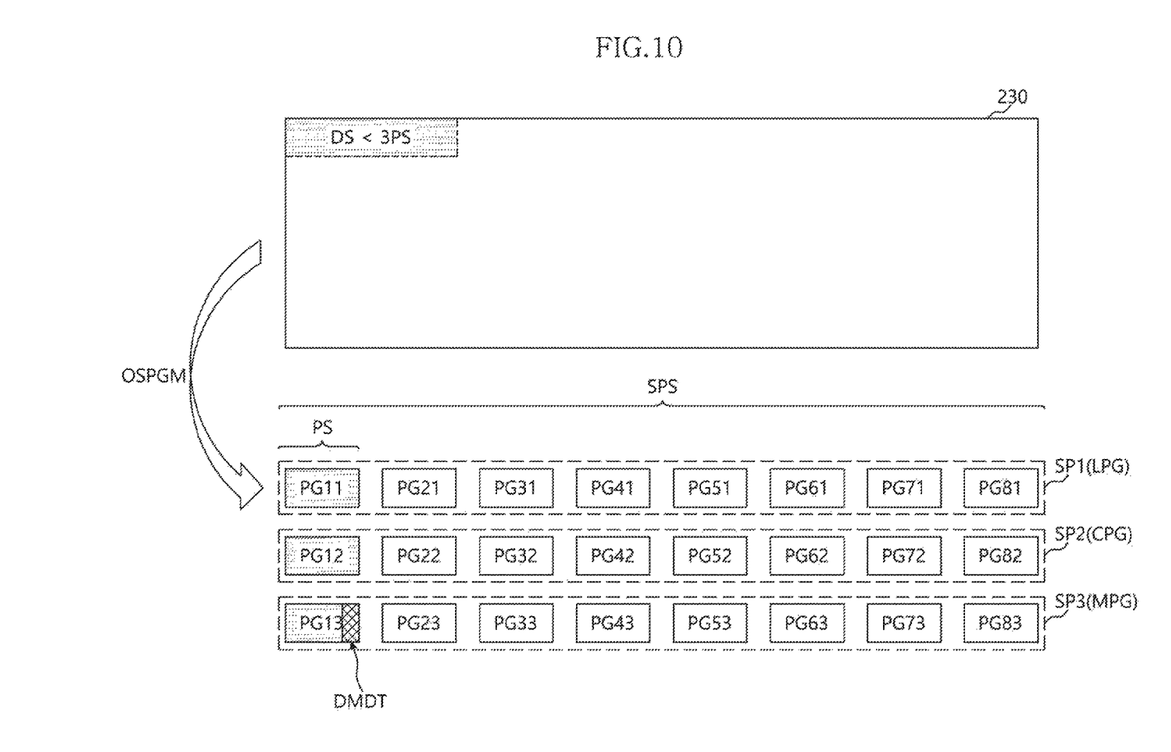

FIGS. 9 and 10 are diagrams illustrating a one-shot program method in accordance with an embodiment.

FIG. 9 illustrates a case where a request to store data having a data size DS smaller than one super page size SPS and equal to or larger than three times a page size 3PS is provided from the host device and the write-requested data is temporarily stored in the random access memory 230 used as a data cache memory.

Although size of data stored in the random access memory 230 is not large enough to be programmed into the nonvolatile memory devices NVM1 and NVM2 through any one between the program methods SPOSPGM and SPPGM described above with reference to FIGS. 7 and 8, there may be a case where it is necessary to immediately store the not-large-enough data of the random access memory 230 in the nonvolatile memory device NVM1 or NVM2. For example, in the case where a force unit access (FUA) command or a cache flush command is transmitted from the host device or entry to a power-saving state or an idle state is requested from the host device, the not-large-enough data of the random access memory 230 should be immediately stored in the nonvolatile memory device NVM1 or NVM2.

In the case where data of the random access memory 230 should be immediately stored in the nonvolatile memory device NVM1 or NVM2, the control unit 220 may store the data of the random access memory 230 in the nonvolatile memory device NVM1 or NVM2 by using a one-shot program method OSPGM. For example, the control unit 220 may simultaneously program data of three times the page size 3PS in the LSB page PG11, the CSB page PG12 and the MSB page PG13 which are coupled to the same word line.

In the case where data stored in the random access memory 230 has a smaller size than three times the page size 3PS and it is necessary to immediately store the data of the random access memory 230 in the nonvolatile memory device NVM1 or NVM2, as shown in FIG. 10, the control unit 220 may generate a dummy-padded data of three times the page size 3PS by adding dummy data DMDT to the data of the random access memory 230 and may program the dummy-padded data simultaneously in the LSB page PG11, the CSB page PG12 and the MSB page PG13.

Figure 11:
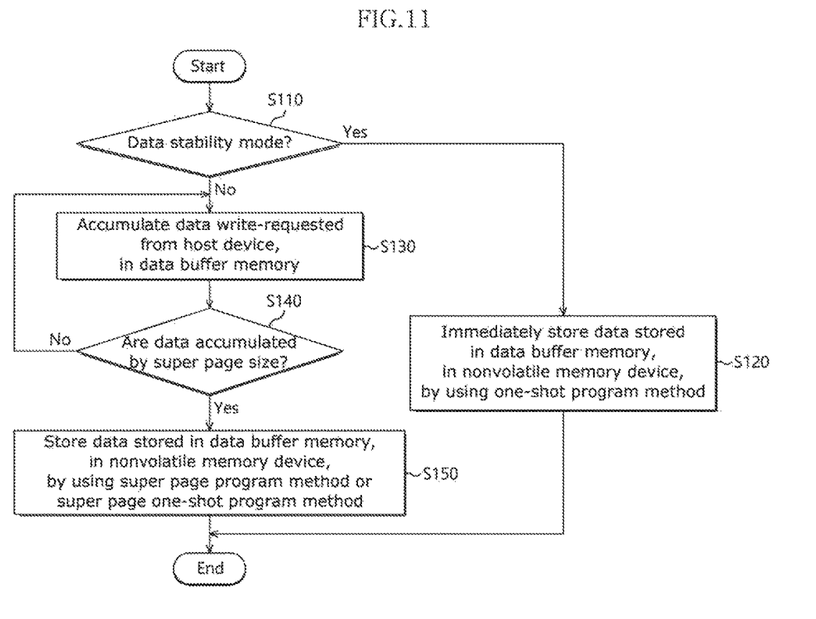
FIG. 11 is a flow chart illustrating the operation of the data storage device, in accordance with an embodiment of the present invention.

FIG. 11 is a flow chart illustrating the operation of the data storage device 100 in accordance with an embodiment of the present invention.

At step S110, the control unit 220 may determine whether it is necessary to operate in a data stability mode. The data stability mode is defined as a mode in which data which are temporarily stored in the random access memory 230 used as a data cache memory should be immediately moved to the nonvolatile memory device NVM1 or NVM2. For instance, the control unit 220 may determine whether a force unit access (FUA) command or a cache flush command is transmitted from the host device. Alternatively, the control unit 220 may determine whether entry to a power-saving state or an idle state is requested from the host device.

When it is determined that it is necessary to operate in the data stability mode, the process may proceed to step S120. When it is determined that it is not necessary to operate in the data stability mode, for example, when it is determined that it is necessary to operate in a performance-improving mode, the process may proceed to step S130.

At step S120, the control unit 220 may immediately store the data of the data cache memory 230 in at least one of the nonvolatile memory device NVM1 or NVM2 by using the one-shot program method OSPGM, as described above with reference to FIG. 9. For example, the control unit 220 may simultaneously program data corresponding to three times the page size 3PS, in an LSB page, a CSB page and an MSB page which are coupled to the same word line. If data having a smaller size than three times the page size 3PS is currently stored in the data cache memory 230, the control unit 220 may generate a dummy-padded data of three times the page size 3PS by adding dummy data DMDT to the data of the random access memory 230 and may program the dummy-padded data simultaneously in an LSB page, a CSB page and an MSB page which are coupled to the same word line, as described above with reference to FIG. 10.

At the step S130, the control unit 220 may continue to accumulate data, which is write-requested from the host device, in the data cache memory 230.

At step S140, the control unit 220 may determine whether the size of the data which is stored so far in the data cache memory 230 is a super page size. When it is determined that the size of the data in the data cache memory 230 is the super page size, the process may proceed to step S150. When it is determined that the size of the data in the data cache memory 230 is under the super page size, the process may return to the step S130, and data write-requested from the host device may be continuously accumulated in the data cache memory 230.

At step S150, the control unit 220 may store the data of the data cache memory 230 in the nonvolatile memory device NVM1 or NVM2 by using the super page one-shot program method SPOSPGM or the super page program method SPPGM, as described above with reference to FIG. 7 or 8. For example, the control unit 220 may store data corresponding to one super page size SPS in any one among the super pages. For another example, the control unit 220 may store data, which has a size of three times the super page size 3SPS in the data cache memory 230, in an LSB type super page, a CSB type super page and an MSB type super page.

While the invention has been described in reference to various specific embodiments, it will be understood to those skilled in the art to which the invention belongs that the embodiments described are examples only. Accordingly, the invention should not be limited only to the data storage device and the operating method of the described embodiments.

What is claimed is:

1. A data storage device comprising:
a first nonvolatile memory device including a first least significant bit (LSB) page, a first central significant bit (CSB) page and a first most significant bit (MSB) page;
a second nonvolatile memory device including a second LSB page, a second CSB page and a second MSB page;
a data cache memory is configured to store data write-requested from a host device; and
a control unit suitable for configuring the first LSB page and the second LSB page as an LSB super page, configuring the first CSB page and the second CSB page as a CSB super page, and -configuring the first MSB page and the second MSB page as an MSB super page,
wherein the control unit is configured to one-shot programs the data stored in the data cache memory in the first LSB page, the first CSB page and the first MSB page in a data stability mode, and is configured to one-shot programs data stored in the data cache memory in the LSB super page, the CSB super page and the MSB super page in a performance-improving mode,
wherein the data stability mode is enabled according to a force unit access (FUA) command or a cache flush command.

2. The data storage device according to claim 1, wherein the data stability mode is enabled in a power-saving state or an idle state of the data storage device.

3. The data storage device according to claim 1, wherein in the data stability mode, the control unit is configured to determine whether a size of a data stored in the data cache memory is smaller than a total size of the first LSB page, the first CSB page and the first MSB page.

4. The data storage device according to claim 3, wherein the control unit is configured to add dummy data to the data stored in the data cache memory, when the size of the data stored in the data cache memory is smaller than the total size of the first LSB page, the first CSB page and the first MSB page.

5. The data storage device according to claim 4, wherein the control unit is configured to programs in one-shot the data stored in the data cache memory and the dummy data, in the first LSB page, the first CSB page and the first MSB page.

6. The data storage device according to claim 1, wherein the control unit is configured to one-shot program the data in the LSB super page, the CSB super page and the MSB super page by accessing the first and second nonvolatile memory device in parallel.

7. A method for operating a data storage device including a first nonvolatile memory device including a first lower page, a first middle page and a first upper page, a second nonvolatile memory device including a second lower page, a second middle page and a second upper page and a data cache memory temporarily storing data write-requested from a host device, the method comprising:
configuring the first lower page and the second lower page as a first super page, configuring the first middle page and the second middle page as a second super page, and configuring the first upper page and the second upper page as a third super page;
simultaneously programming data stored in the data cache memory, in the first lower page, the first middle page and the first upper page in a data stability mode; and
simultaneously programming data stored in the data cache memory, in the first super page, the second super page and the third super page in the data stability mode,
wherein the data stability mode is enabled according to a force unit access (FUA) command or a cache flush command.

8. The method according to claim 7, wherein the data stability mode is enabled in a power-saving state or an idle state of the data storage device.

9. The method according to claim 7, further comprising:
determining whether a size of data stored in the data cache memory is smaller than a size of the first lower page, the first middle page and the first upper page, in the data stability mode.

10. The method according to claim 9, further comprising:
adding dummy data to data stored in the data cache memory, when it is determined that a size of the data stored in the data cache memory is smaller than the total size of the first lower page, the first middle page and the first upper page.

11. The method according to claim 10, further comprising:
simultaneously programming the data stored in the data cache memory and the dummy data, in the first lower page, the first middle page and the first upper page.

12. The method according to claim 7, wherein the simultaneously programming of the data in the first super page, the second super page and the third super page comprises programming the data in the LSB super page, the CSB super page and the MSB super page by accessing the first and second nonvolatile memory devices in parallel.

13. A data storage device comprising:
a plurality of memory devices each including one or more multi-level cell (MLC) pages, wherein the MLC pages respectively selected from the respective memory devices are operable as MLC super pages;
a data cache memory suitable for caching data; and a control unit suitable for controlling the memory devices to perform an one-shot program operation to the MLC super pages with the cached data, wherein the control unit is further suitable for controlling the memory devices to perform an one-shot program operation to the MLC pages of a selected one among the memory devices with the cached data in a data stability mode, wherein the control unit is configured to be operated in the data stability mode, when a force unit access (FUA) command or a cache flush command is inputted from a host device.

14. The data storage device according to claim 13, wherein the control unit, when the cached data has a smaller size than a size of the MLC pages in the data stability mode, further generates a dummy-padded data having the size of the MLC pages by adding dummy data to the cached data, and controls the memory devices to store the dummy-padded data into the MLC pages.

15. The data storage device according to claim 13, wherein the MLC pages include:
   a lower page configured to store lower bit data;
   a middle page configured to store middle bit data; and
   an upper page configured to store upper bit data.

16. The data storage device according to claim 15, wherein the MLC super pages include:
   a lower super page including the lower pages respectively selected from the memory devices;
   a middle super page including the middle pages respectively selected from the memory devices; and
   an upper super page including the upper pages respectively selected from the memory devices.

17. The data storage device according to claim 13, wherein the control unit is configured to be operated in the data stability mode, when a request to enter to a power-saving state or an idle state is inputted from a host device.

* * * * *